United States Patent
Yu et al.

(10) Patent No.: US 10,971,477 B2
(45) Date of Patent: Apr. 6, 2021

(54) SEMICONDUCTOR PACKAGES AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Ming Hung Tseng, Toufen Township (TW); Yen-Liang Lin, Taichung (TW); Tzu-Sung Huang, Tainan (TW); Tin-Hao Kuo, Hsinchu (TW); Hao-Yi Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/390,275

(22) Filed: Apr. 22, 2019

(65) Prior Publication Data
US 2019/0244935 A1 Aug. 8, 2019

Related U.S. Application Data

(63) Continuation of application No. 15/782,993, filed on Oct. 13, 2017, now Pat. No. 10,269,773.
(Continued)

(51) Int. Cl.
*H01L 21/56* (2006.01)
*H01L 25/065* (2006.01)
(Continued)

(52) U.S. Cl.
CPC .......... *H01L 25/0657* (2013.01); *H01L 21/56* (2013.01); *H01L 21/561* (2013.01);
(Continued)

(58) Field of Classification Search
CPC .......... H01L 25/0657; H01L 21/76802; H01L 24/05; H01L 21/76871; H01L 21/76877;
(Continued)

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

CN 103681561 A 3/2014
CN 106373930 A 2/2017
(Continued)

*Primary Examiner* — Latanya N Crawford Eason
(74) *Attorney, Agent, or Firm* — Haynes and Boone, LLP

(57) ABSTRACT

A device is provided, including: a first device package including: a first redistribution structure including a first redistribution line and a second redistribution line; a die on the first redistribution structure; a first via coupled to a first side of the first redistribution line; a second via coupled to a first side of the second redistribution line and extending through the second redistribution line; an encapsulant surrounding the die, the first via, and the second via; and a second redistribution structure over the encapsulant, the second redistribution structure electrically connected to the die, the first via, and the second via; a first conductive connector coupled to a second side of the first redistribution line, the first conductive connector disposed along a different axis than a longitudinal axis of the first via; and a second conductive connector coupled to a second side of the second redistribution line, the second conductive connector disposed along a longitudinal axis of the second via.

19 Claims, 15 Drawing Sheets

Related U.S. Application Data

(60) Provisional application No. 62/565,321, filed on Sep. 29, 2017.

(51) Int. Cl.
| | |
|---|---|
| *H01L 23/00* | (2006.01) |
| *H01L 23/498* | (2006.01) |
| *H01L 21/768* | (2006.01) |
| *H01L 25/00* | (2006.01) |
| *H01L 21/683* | (2006.01) |
| *H01L 23/31* | (2006.01) |
| *H01L 23/538* | (2006.01) |
| *H01L 25/10* | (2006.01) |

(52) U.S. Cl.
CPC ........ *H01L 21/568* (2013.01); *H01L 21/6835* (2013.01); *H01L 21/76871* (2013.01); *H01L 21/76877* (2013.01); *H01L 23/3128* (2013.01); *H01L 23/49816* (2013.01); *H01L 23/49838* (2013.01); *H01L 23/5389* (2013.01); *H01L 24/05* (2013.01); *H01L 24/06* (2013.01); *H01L 24/14* (2013.01); *H01L 24/19* (2013.01); *H01L 24/20* (2013.01); *H01L 25/105* (2013.01); *H01L 25/50* (2013.01); *H01L 21/563* (2013.01); *H01L 23/3107* (2013.01); *H01L 2221/68345* (2013.01); *H01L 2221/68359* (2013.01); *H01L 2221/68372* (2013.01); *H01L 2224/0401* (2013.01); *H01L 2224/04105* (2013.01); *H01L 2224/05124* (2013.01); *H01L 2224/12105* (2013.01); *H01L 2224/214* (2013.01); *H01L 2224/32145* (2013.01); *H01L 2224/32225* (2013.01); *H01L 2224/48091* (2013.01); *H01L 2224/73265* (2013.01); *H01L 2224/73267* (2013.01); *H01L 2224/92244* (2013.01); *H01L 2225/0651* (2013.01); *H01L 2225/06506* (2013.01); *H01L 2225/06568* (2013.01); *H01L 2225/1035* (2013.01); *H01L 2225/1058* (2013.01); *H01L 2924/15311* (2013.01)

(58) Field of Classification Search
CPC ......... H01L 23/49816; H01L 23/49827; H01L 23/5384; H01L 24/14; H01L 24/06; H01L 2225/06568; H01L 2224/05124; H01L 2224/0401; H01L 21/563; H01L 23/3107; H01L 2225/06506
See application file for complete search history.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 8,896,109 | B2 * | 11/2014 | Pagaila .................. H01L 25/50 257/678 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0186676 | A1 * | 7/2013 | Yu ..................... H01L 23/49827 174/257 |
| 2013/0307140 | A1 | 11/2013 | Huang et al. |
| 2014/0077382 | A1 * | 3/2014 | Kwon .................... H01L 22/20 257/773 |
| 2014/0203429 | A1 | 7/2014 | Yu et al. |
| 2014/0210099 | A1 * | 7/2014 | Hu .......................... H01L 24/06 257/774 |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0179591 | A1 | 6/2015 | Tsai et al. |
| 2015/0262909 | A1 | 9/2015 | Chen |
| 2016/0071820 | A1 | 3/2016 | Yu et al. |
| 2016/0233161 | A1 | 8/2016 | Chen et al. |
| 2016/0351494 | A1 | 12/2016 | Chen et al. |
| 2017/0092597 | A1 | 3/2017 | Jeng et al. |
| 2017/0229414 | A1 | 8/2017 | Cheng et al. |
| 2017/0250138 | A1 | 8/2017 | Hsieh et al. |
| 2017/0271311 | A1 | 9/2017 | Lin et al. |
| 2017/0317029 | A1 | 11/2017 | Hsieh et al. |
| 2018/0033771 | A1 | 2/2018 | Yu et al. |
| 2018/0076184 | A1 | 3/2018 | Chen et al. |
| 2018/0096976 | A1 | 4/2018 | Lin et al. |
| 2018/0233457 | A1 * | 8/2018 | Chen .................... H01L 23/295 |

FOREIGN PATENT DOCUMENTS

| | | |
|---|---|---|
| CN | 107134437 A | 9/2017 |
| KR | 20150105183 A | 9/2015 |
| KR | 20150144305 A | 12/2015 |
| KR | 20160029621 A | 3/2016 |
| KR | 20160140322 A | 12/2016 |

* cited by examiner

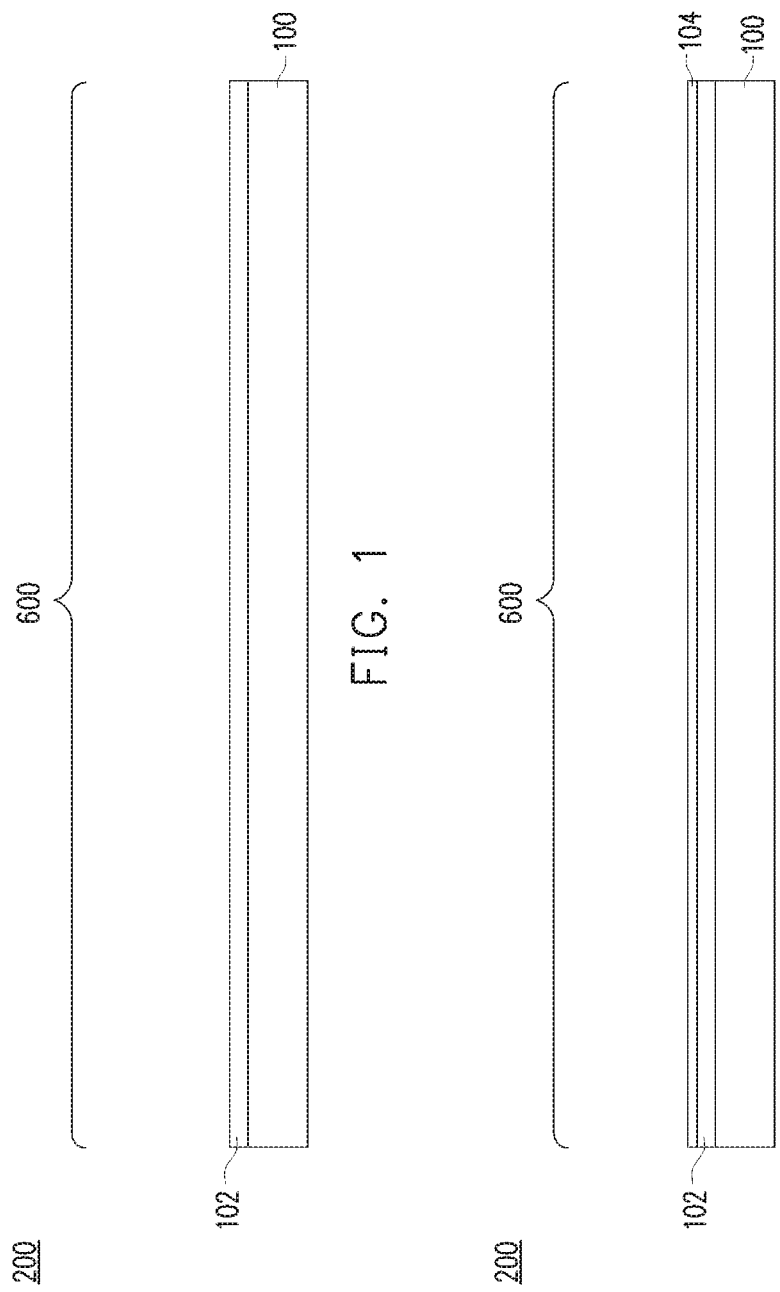

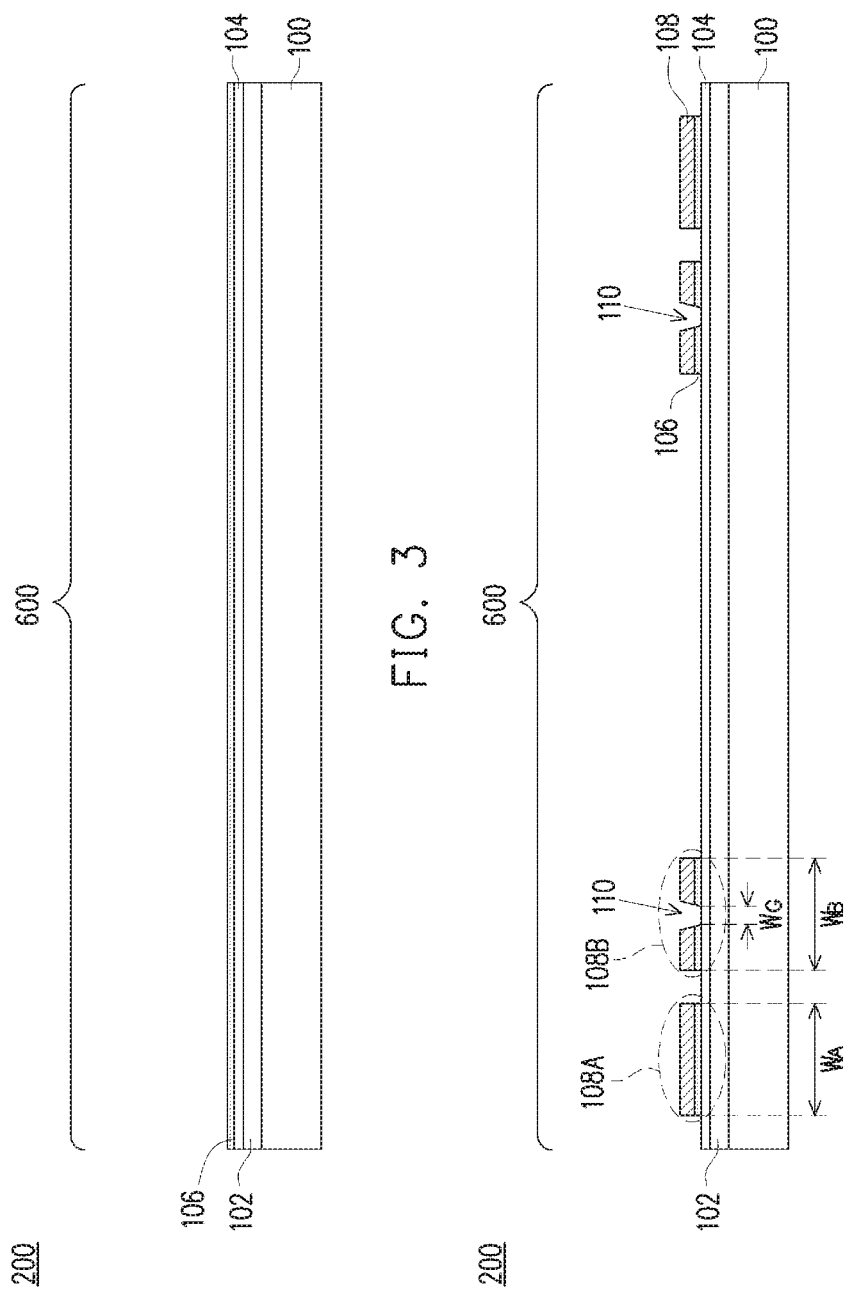

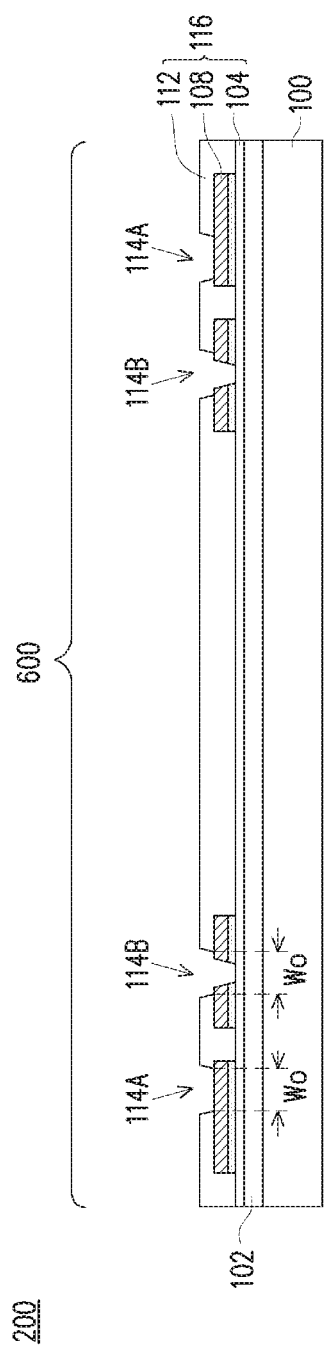
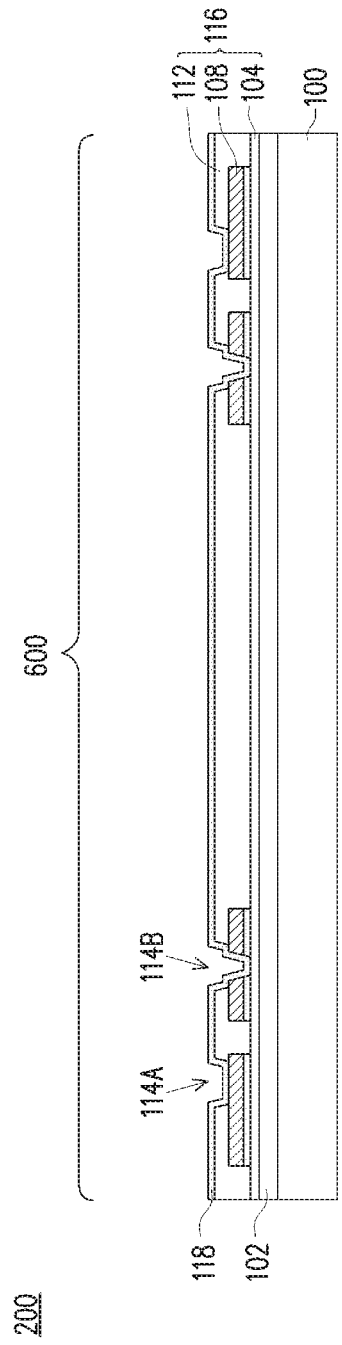

SEMICONDUCTOR PACKAGES AND METHODS OF FORMING THE SAME

PRIORITY CLAIM AND CROSS-REFERENCE

This application is a divisional of U.S. patent application Ser. No. 15/782,993, entitled "Semiconductor Packages and Methods of Forming the Same," filed on Oct. 13, 2017, which claims the benefit of U.S. Provisional Application No. 62/565,321, entitled "Semiconductor Packages and Methods of Forming the Same," filed on Sep. 29, 2017, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 14 are various views of intermediate steps during a process for forming a device package, in accordance with some embodiments.

DETAILED DESCRIPTION

Figure 7:
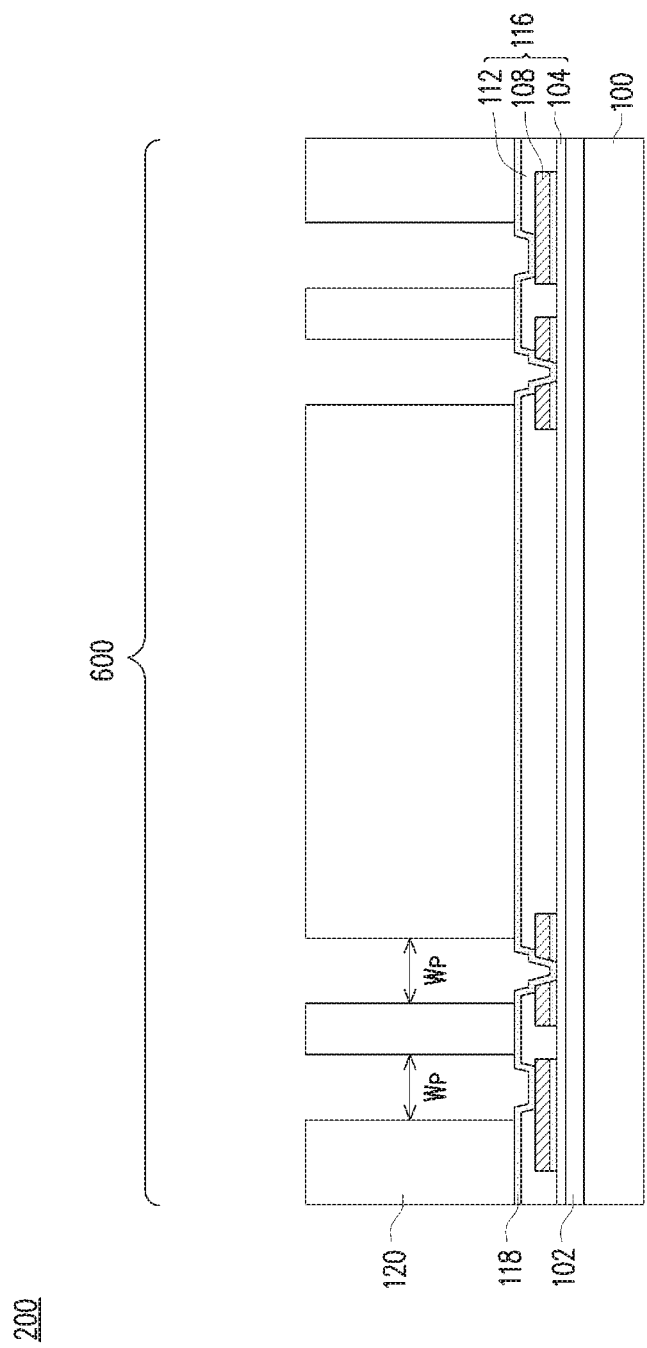

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor packages and methods of forming the same are disclosed, according to some embodiments. In particular, a first redistribution structure is formed having redistribution lines. A first via is formed extending from a surface of a first conductive feature. A second via is formed extending from a gap between a second and third conductive feature. The second via is longer than the first via. Conductive connectors, such as solder, are attached to the back side of the first redistribution structure. A first conductive connector is coupled to the first conductive feature, and is offset from the first via. As a result, an intermetallic compound (IMC) formed during reflow does not extend laterally to the first via. A second conductive connector is coupled to the second and third conductive features, and is aligned with the second via. As a result, when an IMC formed during reflow, copper is diffused from the second via, and not from the second and third conductive features. Avoiding diffusion of copper from the second and third conductive features may avoid delamination of seed layers used during formation of the vias.

FIGS. 1 through 14 are various views of intermediate steps during a process for forming a device package 200, in accordance with some embodiments. FIGS. 1 through 14 are cross-sectional views. The device package 200 may be referred to as an integrated fan-out (InFO) package.

In FIG. 1, the device package 200 is shown at an intermediate stage of processing including a release layer 102 formed on a carrier substrate 100. A package region 600 for the formation of the device package 200 is illustrated. Although only one package region is shown, there may be many package regions formed.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

In FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

In FIG. 3, a seed layer 106 is formed over the dielectric layer 104. In some embodiments, the seed layer 106 is a metal layer, which may be a single layer or a composite layer comprising a plurality of sub-layers formed of different materials. In some embodiments, the seed layer 106 includes a titanium layer and a copper layer over the titanium layer. The seed layer 106 may be formed using, for example, PVD or the like.

In FIG. 4, a metallization pattern 108 is formed over the dielectric layer 104. A photo resist (not shown) is formed and patterned on the seed layer 106. The photo resist may be formed by spin coating or the like and may be exposed to light for patterning. The pattern of the photo resist corresponds to the metallization pattern 108. The patterning forms openings through the photo resist to expose the seed layer 106. A conductive material is formed in the openings of the photo resist and on the exposed portions of the seed layer 106. The conductive material may be formed by plating, such as electroplating or electroless plating, or the like. The conductive material may be a metal or a metal alloy, such as copper, titanium, tungsten, aluminum, the like, or combinations thereof. Then, the photo resist and portions of the seed layer 106 on which the conductive material is not formed are removed. The photo resist may be removed by an acceptable ashing or stripping process, such as using an oxygen plasma or the like. Once the photo resist is removed, exposed portions of the seed layer 106 are removed, such as by using an acceptable etching process, such as by wet or dry etching. The remaining portions of the seed layer 106 and conductive material form the metallization pattern 108.

The conductive features of the metallization pattern 108 may be referred to as redistribution layers or redistribution lines. The redistribution lines may not be formed to have a uniform width, and some of the redistribution lines may include multiple conductive features. First redistribution lines 108A may each include a single conductive feature that will be electrically connected to devices of the device package 200. Second redistribution lines 108B may each include a plurality of conductive features that are separated by a gap 110, and are electrically connected together and to devices of the device package 200. The combined width $W_B$ of the second redistribution lines 108B may be substantially equal to the width $W_A$ of the first redistribution lines 108A, or may be different.

In some embodiments, the conductive features of the second redistribution lines 108B are formed separately during formation of the metallization pattern 108, e.g., each conductive feature may correspond to an opening in the photo resist exposing the seed layer 106. In some embodiments, a single conductive feature is formed during formation of the metallization pattern 108, and the gaps 110 are formed afterwards using acceptable etching techniques to divide the single conductive feature into a plurality of conductive features. The gaps 110 are formed to have a width $W_G$. The gaps 110 may extend from top surfaces of the second redistribution lines 108B to bottom surfaces of the second redistribution lines 108B such that the dielectric layer 104 is exposed. The gaps 110 may be formed in a center of the second redistribution lines 108B such that the conductive features of the second redistribution lines 108B are a same length, or may be formed offset from the center of the second redistribution lines 108B such that the conductive features of the second redistribution lines 108B are a different length.

In FIG. 5, a dielectric layer 112 is formed on the metallization pattern 108 and the dielectric layer 104. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof.

The dielectric layer 112 is then patterned to form openings 114 to expose portions of the metallization pattern 108. The patterning may be by an acceptable process, such as by exposing the dielectric layer 112 to light when the dielectric layer is a photo-sensitive material or by etching using, for example, an anisotropic etch. First openings 114A are formed exposing the first redistribution lines 108A, and second openings 114B are formed exposing the second redistribution lines 108B. The second openings 114B are formed over the gaps 110 of the second redistribution lines 108B; as such, sides of the conductive features are exposed, portions of the top surfaces of the conductive features are exposed, and portions of the dielectric layer 104 are exposed. In the illustrated embodiment, the first openings 114A and second openings 114B each have a same width $W_O$. In other embodiments, the first openings 114A and second openings 114B have different widths. The width $W_O$ of the openings 114 is greater than the width $W_G$ of the gaps 110.

The openings 114 may be formed over a center of each of the metallization patterns 108, or may be formed offset from the center. In the embodiment shown, the first openings 114A are formed offset from the centers of the metallization patterns 108, and the second openings 114B are formed over centers of the metallization patterns 108.

The dielectric layers 104 and 112 and the metallization patterns 108 may be referred to as a back-side redistribution structure 116. As illustrated, the back-side redistribution structure 116 includes the two dielectric layers 104 and 112 and one metallization pattern 108. In other embodiments, the back-side redistribution structure 116 can include any number of dielectric layers, metallization patterns, and vias. One or more additional metallization patterns and dielectric layers may be formed in the back-side redistribution structure 116 by repeating the processes for forming the metallization patterns 108 and dielectric layer 112. Vias may be formed during the formation of a metallization pattern by forming the seed layer and conductive material of the metallization pattern in the opening of the underlying dielectric layer. The vias may therefore interconnect and electrically couple the various metallization patterns.

In FIG. 6, a seed layer 118 is formed over the back-side redistribution structure 116 and in the openings 114. The seed layer 118 is over the dielectric layer 112, exposed portions of the metallization pattern 108, and exposed portions of the dielectric layer 104. In some embodiments, the seed layer 118 is a metal layer, which may be a single layer or a composite layer comprising a plurality of sub-layers formed of different materials. In some embodiments, the seed layer 118 comprises a titanium layer and a copper layer over the titanium layer. The seed layer 118 may be formed using, for example, PVD or the like.

In FIG. 7, a photo resist 120 is formed and patterned on the seed layer 118. The photo resist 120 may be formed by spin coating or the like and may be exposed to light for patterning. The pattern of the photo resist 120 corresponds to through vias that will be subsequently formed. The patterning forms openings through the photo resist 120 to expose the seed layer 118. The openings through the photo resist 120 are disposed over the openings 114 in the dielectric layer 112, and may have a same width $W_P$ over both the first openings 114A and second openings 114B. The width $W_P$ of the openings is greater than the width $W_O$ of the openings 114.

Figure 8:
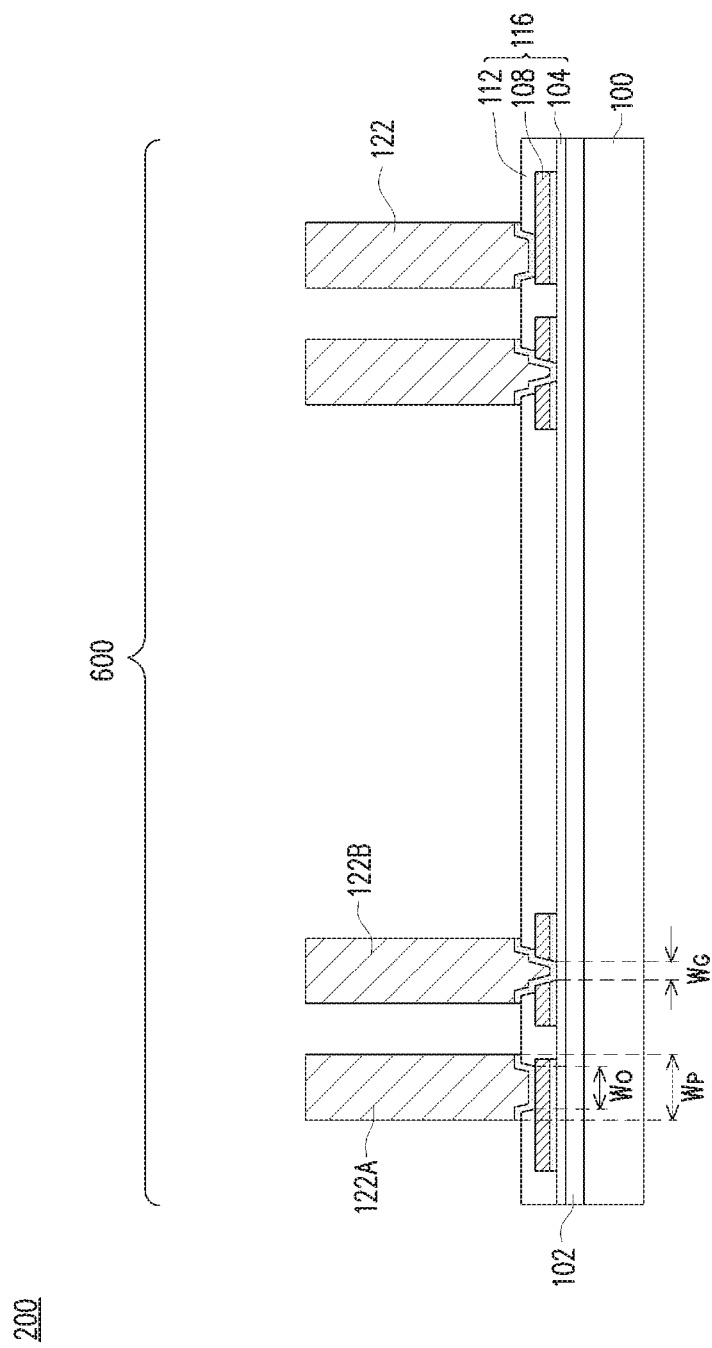

In FIG. 8, a conductive material is formed in the openings of the photo resist 120 and on the exposed portions of the seed layer 118. The conductive material may be formed by plating, such as electroplating or electroless plating, or the like. The conductive material may be a metal or a metal alloy, such as copper, titanium, tungsten, aluminum, the like, or combinations thereof. The photo resist 120 and portions of the seed layer 118 on which the conductive material is not formed are removed. The photo resist may be removed by an acceptable ashing or stripping process, such as using an oxygen plasma or the like. Once the photo resist is removed, exposed portions of the seed layer 118 are removed, such as by using an acceptable etching process, such as by wet or dry etching. The remaining portions of the seed layer and conductive material form through vias 122 electrically connected to the redistribution lines.

Because the seed layer 118 is formed in the gaps 110 of the second redistribution lines 108B, second vias 122B are formed extending through the second redistribution lines 108B. Conversely, first vias 122A are formed on the first redistribution lines 108A, and do not extend through the first redistribution lines 108A. The first vias 122A and second vias 122B may both have the same width $W_P$ over the dielectric layer 112, and the same width $W_O$ in the openings 114. The second vias 122B have also the width $W_G$ in the gaps 110. Because the second vias 122B have three different widths, each of a descending width, the second vias 122B may be referred to as having a ladder structure. Because the first openings 114A were formed offset from the centers of the metallization patterns 108, the first vias 122A are formed offset from the centers of the first redistribution lines 108A.

Although the first vias 122A are illustrated as having one change in widths, and the second vias 122B are illustrated as having two changes in widths, it should be appreciated that the first vias 122A and second vias 122B may have any quantity of changes in widths in other embodiments. According to embodiments, the second vias 122B have more changes in widths than the first vias 122A.

Figure 9:
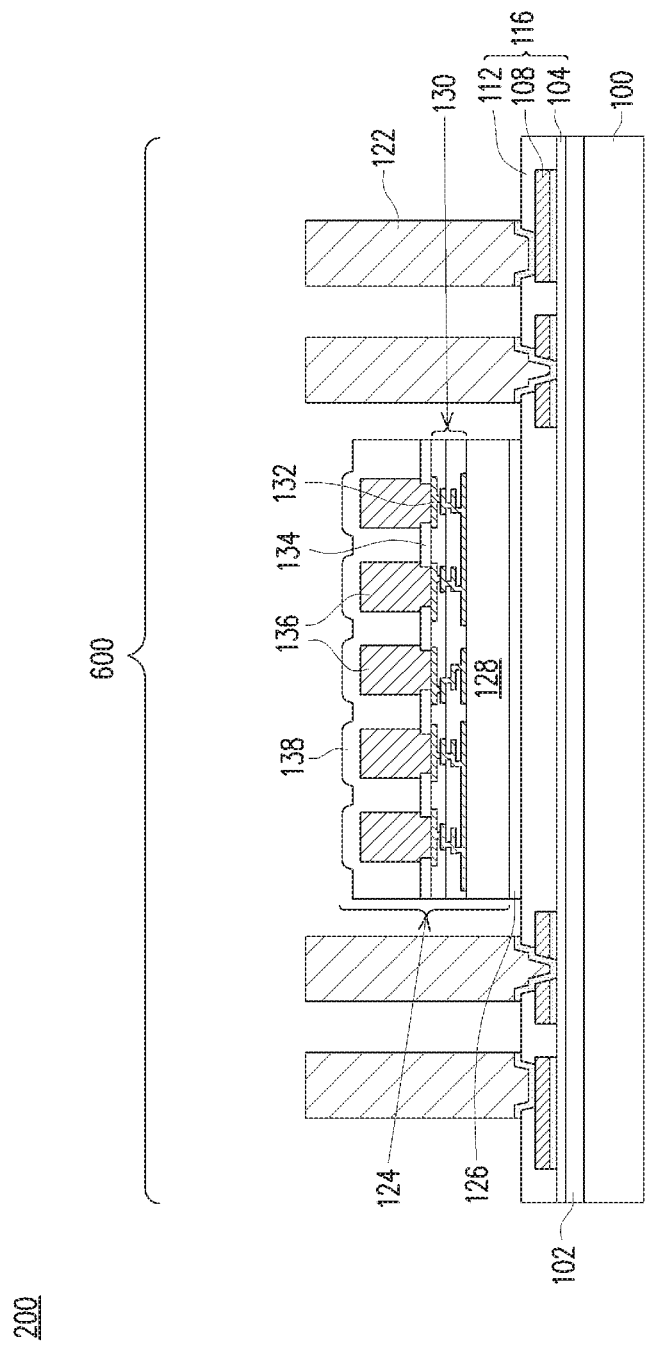

In FIG. 9, integrated circuit dies 124 are adhered to the dielectric layer 112 by an adhesive 126. As illustrated in FIG. 4, one integrated circuit die 124 is adhered in the package region 600. In other embodiments, multiple integrated circuit dies 124 may be adhered in each region. The integrated circuit dies 124 may be bare dies, such as, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 124 in the different package regions (now shown) may be different sizes (e.g., different heights and/or surface areas), and in other embodiments, the integrated circuit dies 124 may be the same size (e.g., same heights and/or surface areas).

Before being adhered to the dielectric layer 112, the integrated circuit dies 124 may be processed according to applicable manufacturing processes to form integrated circuits in the integrated circuit dies 124. For example, the integrated circuit dies 124 each include a semiconductor substrate 128, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 128 and may be interconnected by interconnect structures 130 formed by, for example, metallization patterns in one or more dielectric layers on the semiconductor substrate 128 to form an integrated circuit.

The integrated circuit dies 124 further comprise pads 132, such as aluminum pads, to which external connections are made. The pads 132 are on what may be referred to as respective active sides of the integrated circuit dies 124. Passivation films 134 are on the integrated circuit dies 124 and on portions of the pads 132. Openings are through the passivation films 134 to the pads 132. Die connectors 136, such as conductive pillars (for example, comprising a metal such as copper), are in the openings through the passivation films 134 and are mechanically and electrically coupled to the respective pads 132. The die connectors 136 may be formed by, for example, plating, or the like. The die connectors 136 electrically couple the respective integrated circuits of the integrated circuit dies 124.

A dielectric material 138 is on the active sides of the integrated circuit dies 124, such as on the passivation films 134 and the die connectors 136. The dielectric material 138 laterally encapsulates the die connectors 136, and the dielectric material 138 is laterally coterminous with the respective integrated circuit dies 124. The dielectric material 138 may be initially formed to bury or cover the die connectors 136; when the die connectors 136 are buried, the top surface of the dielectric material 138 may have an uneven topology. The dielectric material 138 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 126 is on back-sides of the integrated circuit dies 124 and adheres the integrated circuit dies 124 to the back-side redistribution structure 116, such as the dielectric layer 112 in the illustration. The adhesive 126 may be any suitable adhesive, epoxy, die attach film (DAF), or the like. The adhesive 126 may be applied to a back-side of the integrated circuit dies 124, such as to a back-side of the respective semiconductor wafer or may be applied over the surface of the carrier substrate 100. The integrated circuit dies 124 may be singulated, such as by sawing or dicing, and adhered to the dielectric layer 112 by the adhesive 126 using, for example, a pick-and-place tool.

Although the integrated circuit dies 124 are illustrated and described above as being bare dies (e.g., unpackaged dies), in other embodiments, the integrated circuit dies 124 may be packaged chips (e.g., one or more bare dies integrated with other package features, such as, redistribution structures, passive devices, etc.). For example, the integrated circuit dies 124 may be a memory package (e.g., a hybrid memory cube) comprising a plurality of stacked and interconnected memory dies.

Figure 10:
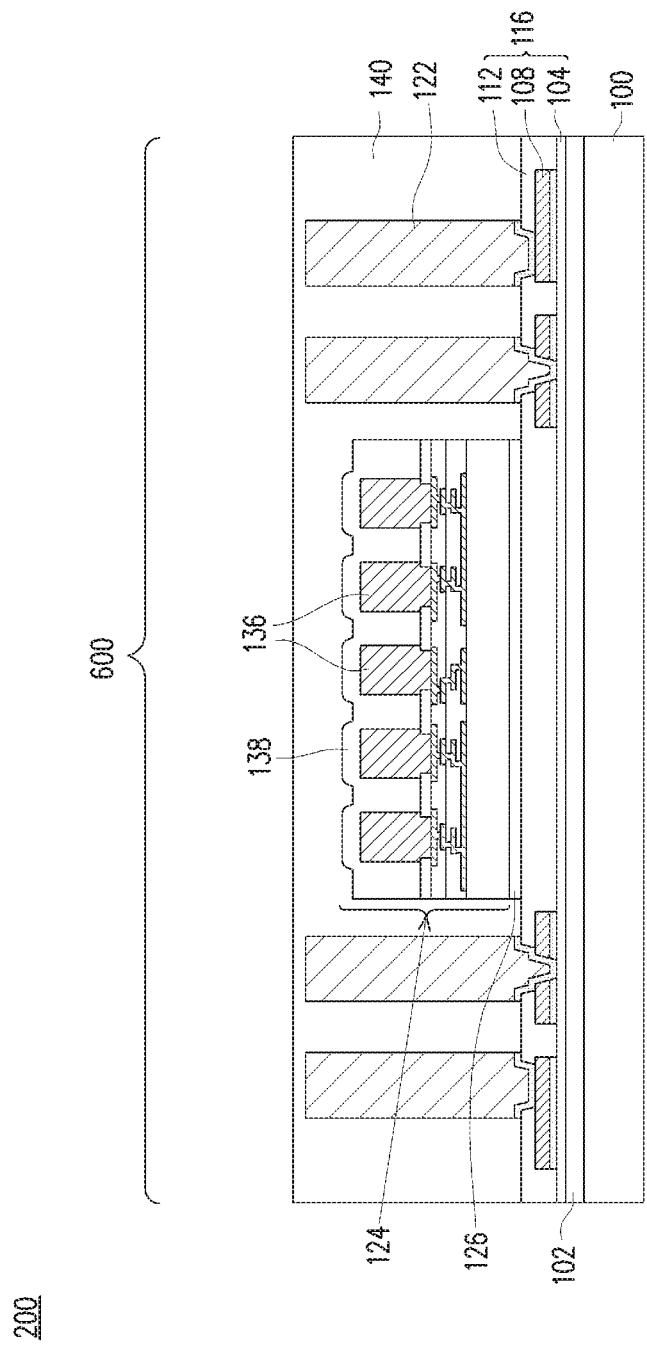

In FIG. 10, an encapsulant 140 is formed on the various components. The encapsulant 140 may be a molding compound, epoxy, or the like, and may be applied by compression molding, transfer molding, or the like. The encapsulant 140 may be formed over the carrier substrate 100 such that the die connectors 136 of the integrated circuit dies 124 and/or the through vias 122 are buried or covered. The encapsulant 140 is then cured.

Figure 11:
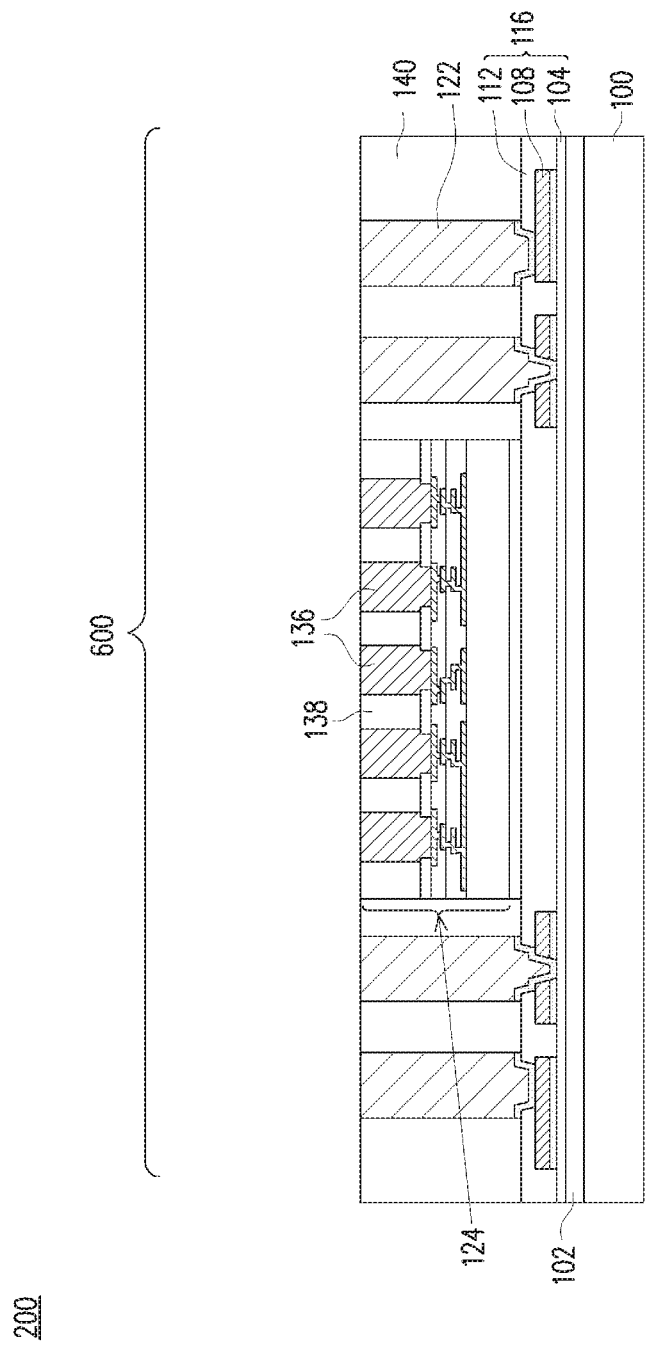

In FIG. 11, a planarization process is performed on the encapsulant 140 to expose the through vias 122 and the die connectors 136. The planarization process may also grind the dielectric material 138. Top surfaces of the through vias 122, die connectors 136, dielectric material 138, and encapsulant 140 are coplanar after the planarization process. The planarization process may be, for example, a chemical-mechanical polish (CMP), a grinding process, or the like. In some embodiments, the planarization may be omitted, for example, if the through vias 122 and die connectors 136 are already exposed. As noted above, the second vias 122B extend through the metallization pattern 108. As such, after the planarization process, the second vias 122B are longer than the first vias 122A when the first vias 122A and the second vias 122B are connected to a same metallization layer of the back-side redistribution structure 116.

Figure 12:
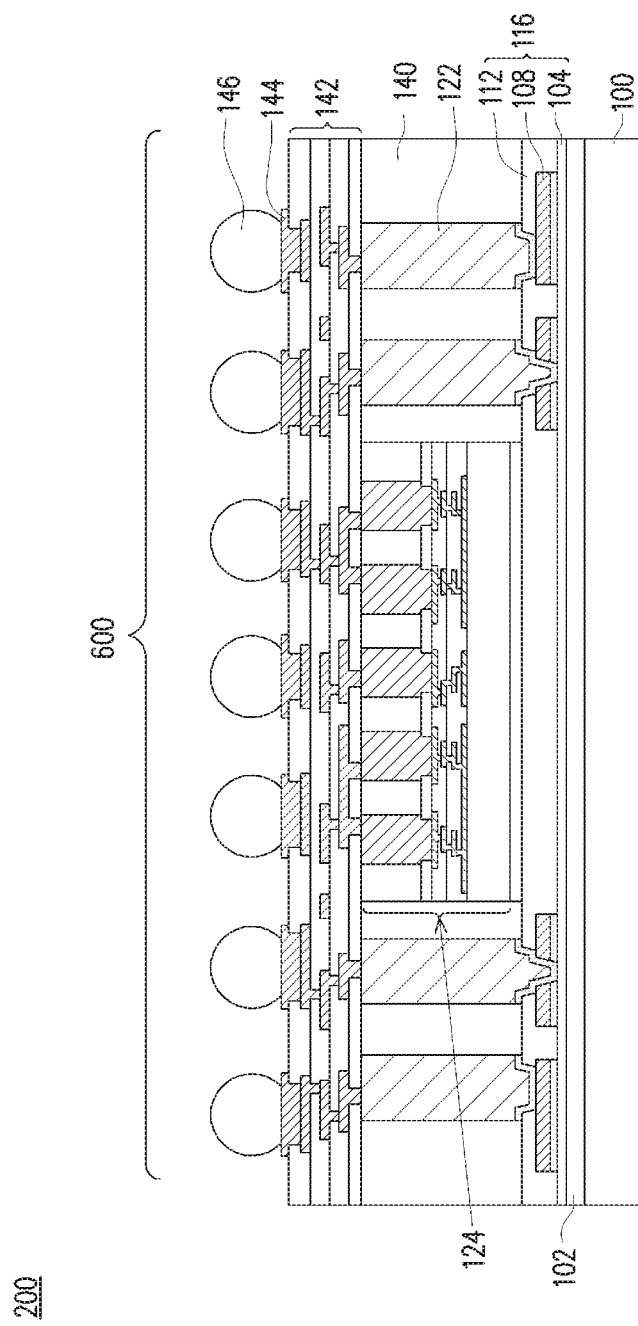

In FIG. 12, a front-side redistribution structure 142 is formed on the encapsulant 140, the through vias 122, and the die connectors 136. The front-side redistribution structure 142 includes multiple dielectric layers and metallization patterns. For example, the front-side redistribution structure 142 may be patterned as a plurality of discrete metallization patterns separated from each other by respective dielectric layer(s).

In some embodiments, the dielectric layers are formed of a polymer, which may be a photo-sensitive material such as PBO, polyimide, BCB, or the like, may be patterned using a lithography mask. In other embodiments, the dielectric layers are formed of a nitride such as silicon nitride; an oxide such as silicon oxide, PSG, BSG, BPSG; or the like. The dielectric layers may be formed by spin coating, lamination, CVD, the like, or a combination thereof.

After formation, the dielectric layers are patterned to expose underlying conductive features. The bottom dielectric layer is patterned to expose portions of the through vias 122 and the die connectors 136, and intermediate dielectric layer(s) are patterned to expose portions of underlying metallization patterns. The patterning may be by an acceptable process, such as by exposing the dielectrics layer to light when the dielectric layers are a photo-sensitive material, or by etching using, for example, an anisotropic etch. If the dielectric layers are photo-sensitive materials, the dielectric layers can be developed after the exposure.

Metallization patterns with vias are formed on each dielectric layer. A seed layer (not shown) is formed over the dielectric layer and in openings through the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photo resist is then formed and patterned on the seed layer. The photo resist may be formed by spin coating or the like and may be exposed to light for patterning. The pattern of the photo resist corresponds to the metallization pattern. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern and vias for one metallization level of the front-side redistribution structure 142.

The front-side redistribution structure 142 is shown as an example. More or fewer dielectric layers and metallization patterns than shown may be formed in the front-side redistribution structure 142. One having ordinary skill in the art will readily understand which steps and processes would be omitted or repeated to form more or fewer dielectric layers and metallization patterns.

The top dielectric layer of the front-side redistribution structure 142 is patterned to expose portions of the metallization patterns for the formation of conductive pads. The conductive pads are used to couple to conductive connectors, and may be referred to as under bump metallurgies (UBMs) 144. The patterning may be by an acceptable process, such as by exposing the top dielectric layer to light when the top dielectric layer is a photo-sensitive material or by etching using, for example, an anisotropic etch. If the top dielectric layer is a photo-sensitive material, the top dielectric layer can be developed after the exposure. The UBMs 144 are then formed on the exterior side of the front-side redistribution structure 142. The UBMs 144 are formed extending through openings in the top dielectric layer to contact the metallization layers of the front-side redistribution structure 142.

As an example to form the UBMs 144, a seed layer (not shown) is formed over the top dielectric layer and in openings through the top dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photo resist is then formed and patterned on the seed layer. The photo resist may be formed by spin coating or the like and may be exposed to light for patterning. The pattern of the photo resist corresponds to the pattern of the conductive pads in the front-side redistribution structure 142. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the UBMs 144.

Conductive connectors 146 are formed on the UBMs 144. The conductive connectors 146 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 146 may be formed of a metal or metal alloy, such as solder, copper, aluminum, gold, nickel, silver, palladium, tin, the like, or a combination thereof. In some embodiments, the conductive connectors 146 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 146 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the UBMs 144. The metal cap layer may include nickel, tin, tin-lead, gold, silver, palladium, indium, nickel-palladium-gold, nickel-gold, the like, or a combination thereof and may be formed by a plating process.

Figure 13:
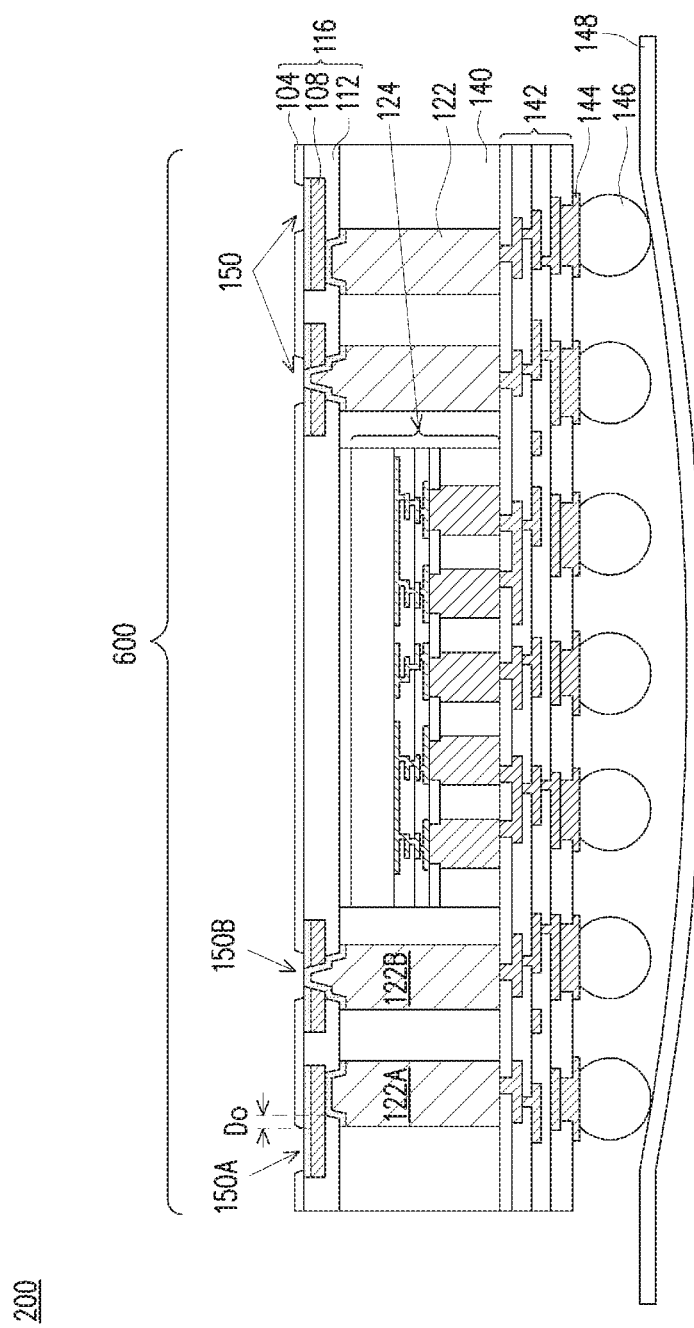

In FIG. 13, a carrier substrate de-bonding is performed to detach (de-bond) the carrier substrate 100 from the backside redistribution structure 116, e.g., the dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on tape 148.

Further in FIG. 13, openings 150 are formed through the dielectric layer 104 to expose portions of the metallization pattern 108. The openings may be formed, for example, using laser drilling, acceptable etching techniques, or the like. First openings 150A are formed exposing the first redistribution lines 108A, and second openings 150B are formed exposing the second redistribution lines 108B. The first openings 150A are formed offset from centers of the first vias 122A, such that the first openings 150A are disposed a distance $D_O$ from portions of the first vias 122A in the dielectric layer 112. The second openings 150B are formed centered under the second vias 122B such that the seed layer 118 and portions of the seed layer 106 extending through the second redistribution lines 108B are exposed.

Figure 14:
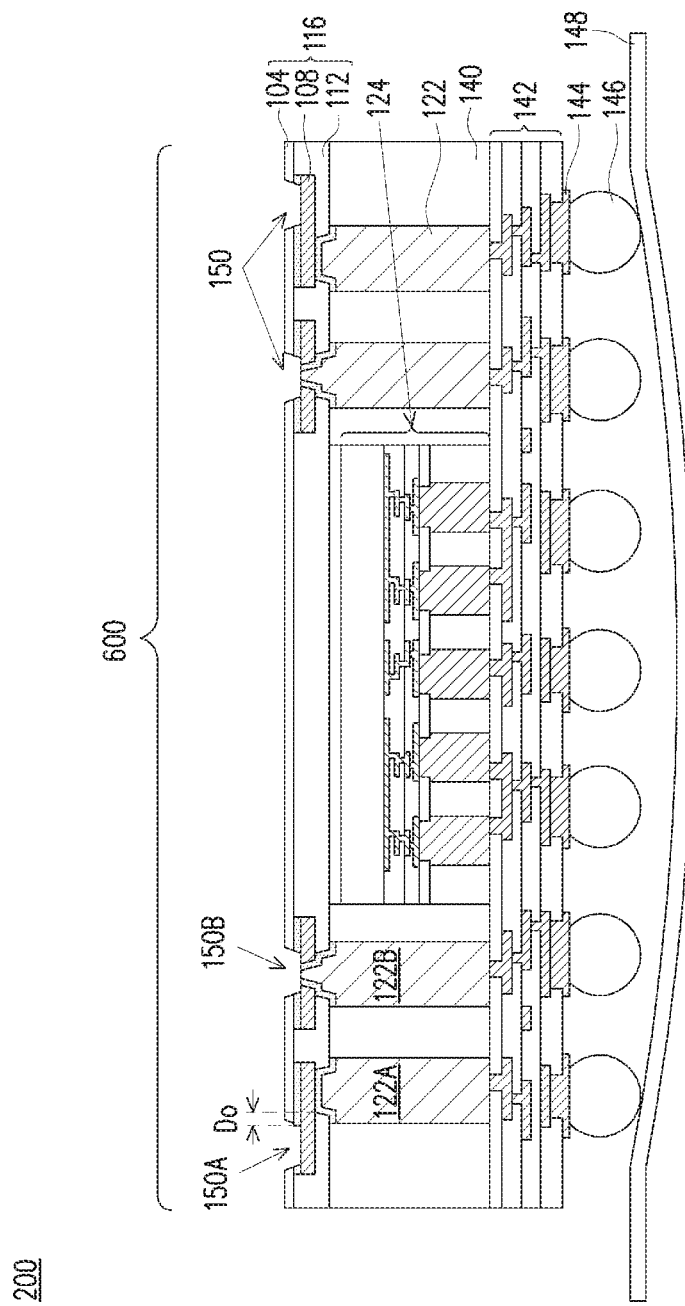

In FIG. 14, portions of the seed layers 106 and 118 exposed by the openings 150 are thinned or completely removed. The exposed portions of the seed layers 106 and 118 may be thinned or removed by an acceptable etching process, such as by wet or dry etching. In embodiments where the seed layers 106 and 118 include multiple layers, the etching process may remove some or all of the exposed multiple layers. In embodiments where the seed layers 106 and 118 include a titanium layer over the dielectric layer 104 and a copper layer over the titanium layer, the etching process may remove the titanium layer and leave the copper layer intact, thereby thinning the layer. In such embodiments, the etching process is performed with one or more etchants that are selective to the titanium layer (e.g., that etch the titanium layer at a substantially higher rate than the copper layer). In other embodiments, the exposed portions of the seed layers 106 and 118 are completely removed (e.g., all layers are removed).

FIGS. 15 through 18 are various views of intermediate steps during a process for forming a package structure 400, in accordance with some embodiments. FIGS. 15 through 18 are cross-sectional views. The package structure 400 may be referred to a package-on-package (PoP) structure.

Figure 15:
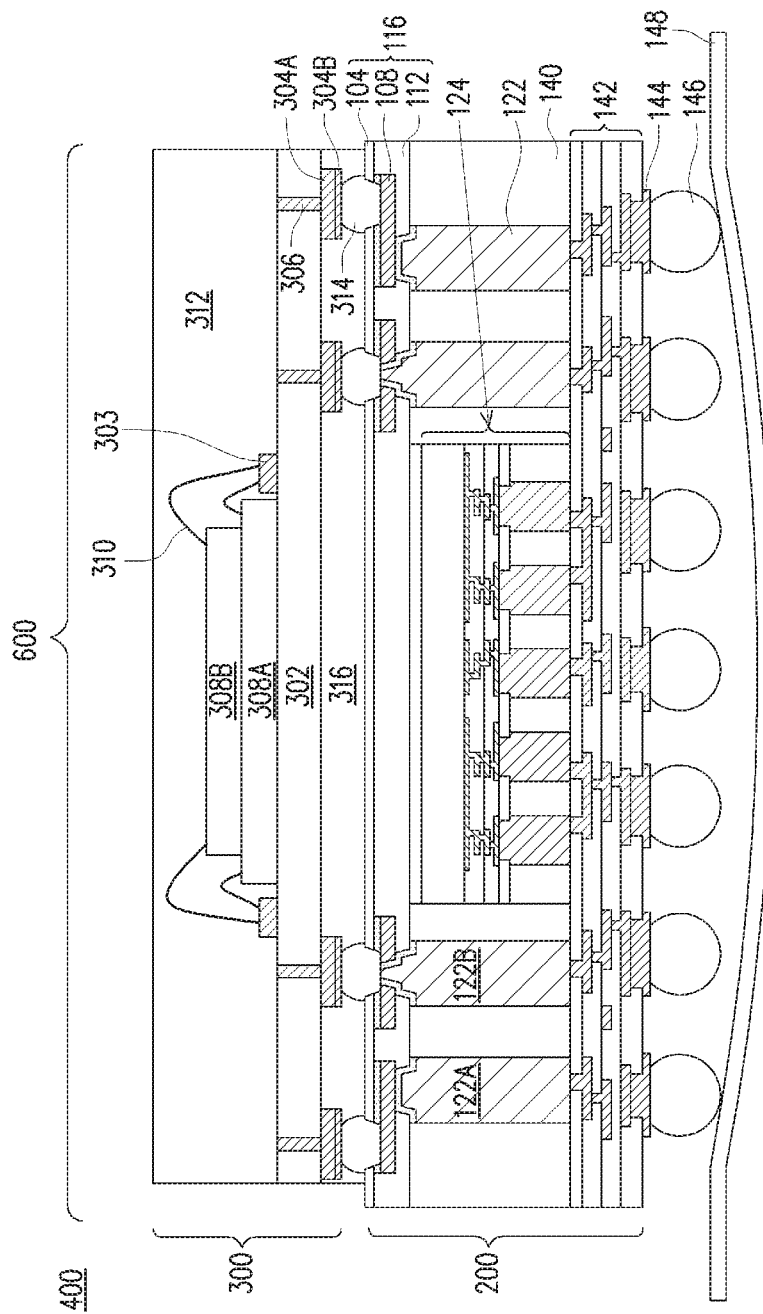
FIGS. 15 through 18 are various views of intermediate steps during a process for forming a package structure, in accordance with some embodiments.

In FIG. 15, a device package 300 is bonded to the device package 200. The device package 300 may be bonded to the device package 200 in each package region 600. The device package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302.

The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and/or passive devices (not shown). As one of ordinary skill in the art will recognize, a wide variety of devices such as transistors, capacitors, resistors, combinations of these, and the like may be used to generate the structural and functional requirements of the design for the device package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. The conductive material of the bond pads 303 and 304 may be copper, tungsten, aluminum, silver, gold, nickel, the like, or a combination thereof.

In an embodiment, the bond pads 303 and 304 are UBMs that include three layers of conductive materials, such as a layer of titanium, a layer of copper, and a layer of nickel. For example, the bond pads 304 may include a layer of titanium (not shown), a main copper portion 304A, and a nickel finish 304B. The nickel finish 304B may improve the shelf life of the device package 300, which may be particularly advantageous when the device package 300 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules. As noted above, in such embodiments, the bond pads 304 may have a nickel finish 304B.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the device package 300.

After the device package 300 is formed, the device package 300 is mechanically and electrically bonded to the device package 200 by way of conductive connectors 314, the bond pads 304, and the metallization pattern 108. In some embodiments, the stacked memory dies 308 are coupled to the integrated circuit dies 124 through the wire bonds 310, bond pads 303 and 304, through vias 306, conductive connectors 314, through vias 122, and front-side redistribution structure 142.

The conductive connectors 314 may be similar to the conductive connectors 146 described above and the description is not repeated herein, although the conductive connectors 314 and the conductive connectors 146 need not be the same. The conductive connectors 314 may be disposed on an opposing side of the substrate 302 as the stacked memory dies 308. In some embodiments, a solder resist (not shown) may also be formed on the side of the substrate 302 opposing the stacked memory dies 308. The conductive connectors 314 may be disposed in openings in the solder resist (not shown) to be electrically and mechanically coupled to conductive features (e.g., the bond pads 304) in the substrate 302. The solder resist may be used to protect areas of the substrate 302 from external damage.

In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 108.

In some embodiments, the conductive connectors 314 may have an optional epoxy flux (not shown) formed thereon before they are reflowed with at least some of the epoxy portion of the epoxy flux remaining after the device package 300 is attached to the device package 200. This remaining epoxy portion may act as an underfill to reduce stress and protect the joints resulting from the reflowing the conductive connectors 314.

Optionally, an underfill material 316 may be formed between the device packages 200 and 300. In an embodiment, the underfill material 316 is a protective material used to cushion and support the device packages 200 and 300 from operational and environmental degradation, such as stresses caused by the generation of heat during operation. The underfill material 316 may be injected or otherwise formed in the space between the device packages 200 and 300 and may, for example, be a liquid epoxy that is dispensed between the device packages 200 and 300, and then cured to harden.

Figure 16C:
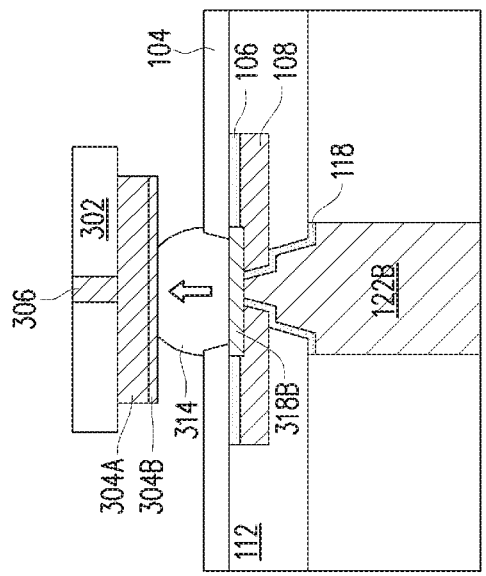
Figure 16D:
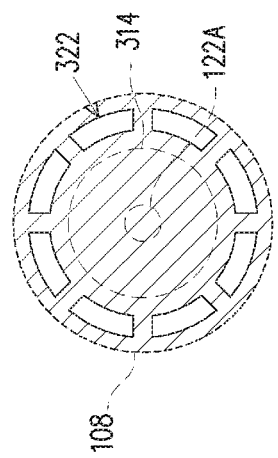
Figure 16A:
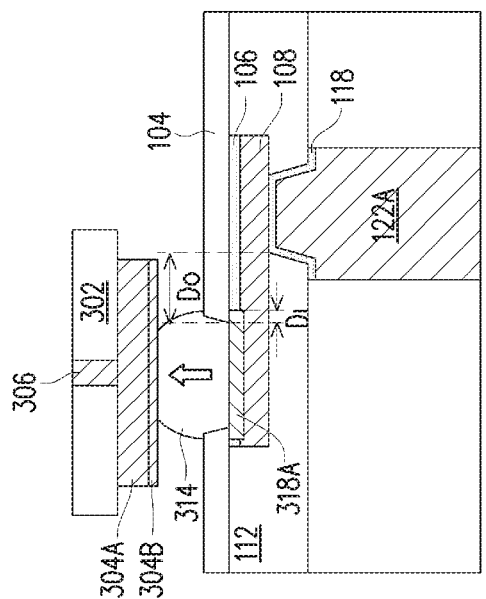
Figure 16B:
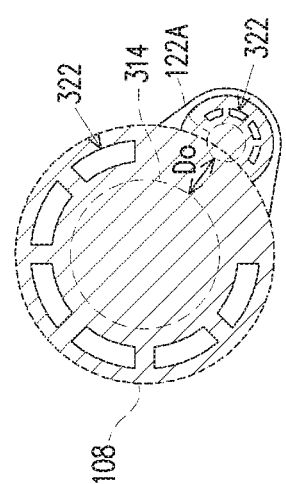

FIGS. 16A, 16B, 16C, and 16D are detailed views of the conductive connectors 314 and metallization patterns 108 after a bonding process is performed to physically and electrically couple the device packages 200 and 300. The bonding between the device packages 200 and 300 may be solder bonding. In an embodiment, the device package 300 is bonded to the device package 200 by a reflow process. FIGS. 16A and 16B are, respectively, cross-sectional and plan views showing a connection for the first redistribution lines 108A. FIGS. 16C and 16D are, respectively, cross-sectional and plan views showing a connection for the second redistribution lines 108B.

In FIGS. 16A, 16B, 16C, and 16D, the bonding process is performed to reflow the conductive connectors 314 such that they are in contact with the bond pads 304 and metallization patterns 108. After the bonding process, an intermetallic compound (IMC) 318 may form at interfaces of the metallization patterns 108 and conductive connectors 314. Because exposed portions of the seed layers 106 and 118 were partially or fully removed, the IMC 318 may extend partially or completely through the metallization patterns 108. The IMC 318 may also extend laterally along the metallization patterns 108 a distance $D_I$ from sides of the first openings 150.

The bonds formed by the bonding process include the conductive connectors 314 (e.g., solder) contacting two different metals. In an embodiment, the metallization patterns 108 are formed of copper, and the bond pads 304 have a nickel finish 304B, resulting in nickel-solder-copper connections. When such connections are formed, copper diffuses from the metallization patterns 108 into the conductive connectors 314 and toward the nickel finish 304B during reflow. A gradient of diffused copper is formed in the conductive connectors 314, in the direction of the solid arrows. Excessive diffusion of copper from the metallization patterns 108 proximate the seed layers 118 may cause delamination of the seed layer 118 from the metallization patterns 108. In particular, diffusion of copper from portions of the metallization patterns 108 between the seed layers 118 and the dielectric layer 104 may cause delamination of the seed layers 118.

In FIGS. 16A and 16B, the first openings 150A in the dielectric layer 104 are disposed laterally a distance $D_O$ from portions of the first vias 122A in the dielectric layer 112. As such, the conductive connectors 314 are disposed laterally the distance $D_O$ from sides of the first vias 122A in a plan view, and are not disposed along the longitudinal axes of the first vias 122A. The distance $D_O$ is chosen to be sufficiently large such that the IMC 318A does not extend laterally to sides of the first vias 122A. In other words, the distance $D_O$ is greater than the distance $D_I$, and may be at least twice as large as the distance $D_I$. In an embodiment, the distance $D_I$ may be from about 2 µm to about 13 µm, such as about 13 µm, and the distance $D_O$ may be from about 25 µm to about 35 µm, such as about 35 µm. Forming the first openings 150A (see, e.g., FIG. 13) such that the IMC 318A does not extend laterally to sides of the first vias 122A may avoid diffusion of copper from portions of the first redistribution lines 108A between the seed layers 118 and the dielectric layer 104, avoiding delamination of the seed layers 118.

In FIGS. 16C and 16D, the second openings 150B in the dielectric layer 104 are disposed laterally aligned with the gaps 110 in the second redistribution lines 108B. As such, the conductive connectors 314 are not spaced laterally from sides of the second vias 122B in a plan view, and are disposed along the longitudinal axes of the second vias 122B. Because exposed portions of the seed layers 106 and 118 were partially or fully removed, the IMC 318B extends in a longitudinal direction into the second vias 122B. Forming the IMC 318B such that it extends into the second vias 122B may result in some diffused copper being sourced from the second vias 122B, instead of the metallization patterns 108. This may reduce the copper diffused from the metallization patterns 108, avoiding delamination of the seed layers 118, and also avoiding reduction of the thickness of the second redistribution lines 108B.

As further shown, the metallization pattern 108 includes slots 322 disposed around the periphery of the conductive connectors 314 and the through vias 122. The slots 322 provide stress relief, improving reliability of the electrical connections. In particular, the slots 322 provide additional sidewalls for the metallization patterns 108, improving the adhesion between the metallization patterns 108 and polyimide materials such as the dielectric layer 112. The slots 322 are disposed at least partially around the conductive connectors 314 in the first redistribution lines 108A, and may be disposed completely around the conductive connectors 314 in the second redistribution lines 108B.

Figure 17:
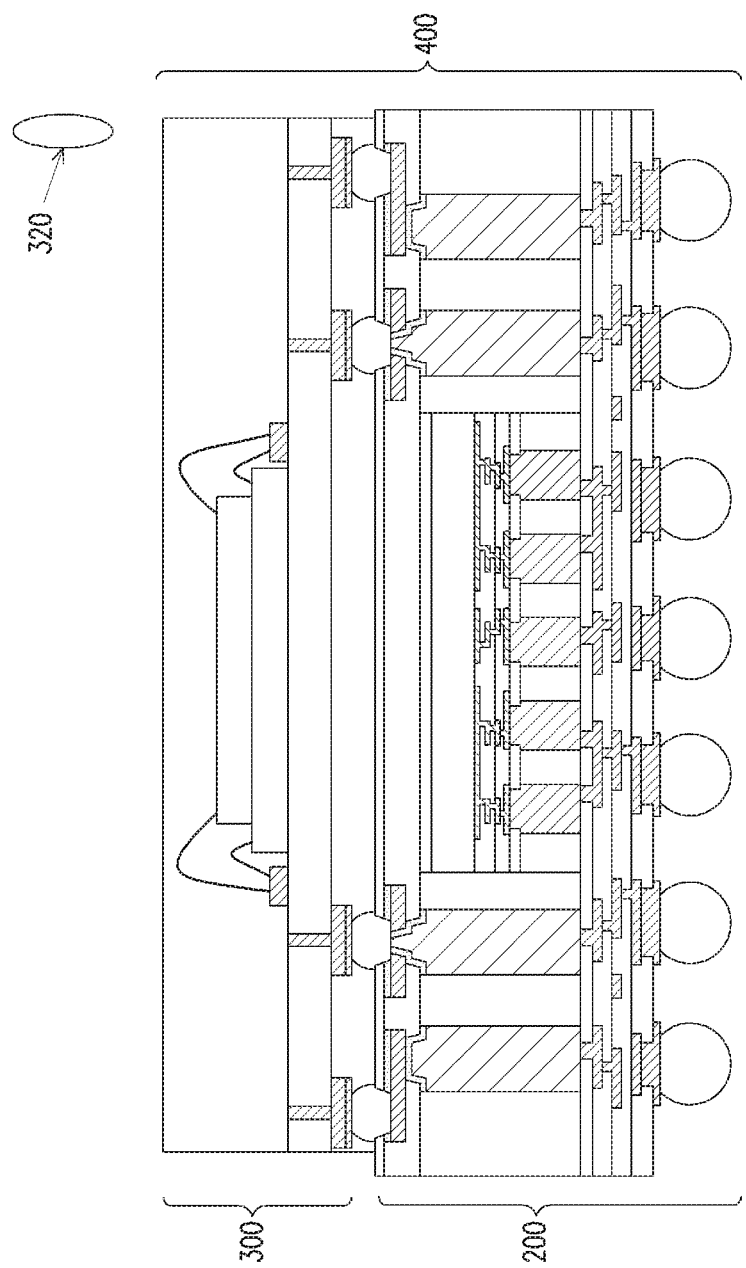

In FIG. 17, a singulation process 320 is performed by singulating along scribe line regions e.g., between adjacent package regions. In some embodiments, the singulation process 320 includes a sawing process, a laser process, or a combination thereof. The singulation process 320 singulates the package region 600 from adjacent package regions (not shown). The resulting package structure 400 is shown after singulation, which may be from the package region 600.

Figure 18:
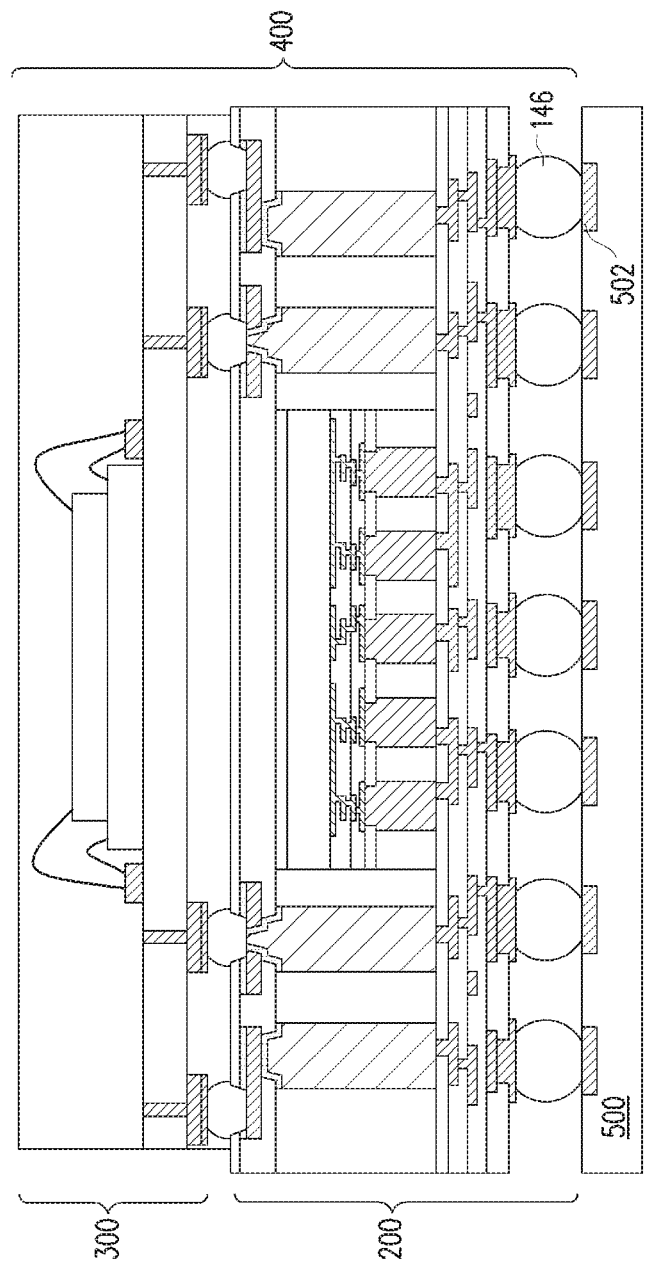

FIG. 18 shows the package structure 400 after it is attached to a substrate 500. The substrate 500 may be referred to a package substrate 500. The package structure 400 is attached to the substrate 500 by mounting the device package 200 to the substrate 500 using the conductive connectors 146.

The package substrate 500 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 500 may be a SOI substrate. Generally, an SOI substrate includes a layer of a semiconductor material such as epitaxial silicon, germanium, silicon germanium, SOI, SGOI, or combinations thereof. The package substrate 500 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 500.

The package substrate 500 may include active and passive devices (not shown. As one of ordinary skill in the art will recognize, a wide variety of devices such as transistors, capacitors, resistors, combinations of these, and the like may be used to generate the structural and functional requirements of the design for the package structure 400. The devices may be formed using any suitable methods.

The package substrate 500 may also include metallization layers and vias (not shown) and bond pads 502 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 500 is substantially free of active and passive devices.

In some embodiments, the conductive connectors 146 are reflowed to attach the device package 200 to the bond pads 502. The conductive connectors 146 electrically and/or physically couple the package substrate 500, including metallization layers in the package substrate 500, to the device package 200. In some embodiments, passive devices (e.g., surface mount devices (SMDs), not illustrated) may be attached to the device package 200 (e.g., bonded to the bond pads 502) prior to mounting on the package substrate 500. In such embodiments, the passive devices may be bonded to a same surface of the device package 200 as the conductive connectors 146.

The conductive connectors 146 may have an epoxy flux (not shown) formed thereon before they are reflowed with at least some of the epoxy portion of the epoxy flux remaining after the device package 200 is attached to the package substrate 500. This remaining epoxy portion may act as an underfill to reduce stress and protect the joints resulting from the reflowing the conductive connectors 146. In some embodiments, an underfill (not shown) may be formed between the device package 200 and the package substrate 500 and surrounding the conductive connectors 146. The underfill may be formed by a capillary flow process after the device package 200 is attached or may be formed by a suitable deposition method before the device package 200 is attached.

Embodiments may achieve advantages. Disposing the conductive connectors 314 laterally a sufficient distance $D_O$ from sides of the first vias 122A in a plan view may avoid diffusion of copper from the metallization patterns 108 proximate the seed layers 118. Forming the IMC 318B such that it extends into the second vias 122B may result in some diffused copper being sourced from the second vias 122B, instead of the metallization patterns 108. Reducing the amount of copper diffused from the metallization patterns 108 under the seed layers 118 may avoid delamination of the seed layers 118, improving the reliability of resulting devices.

In accordance with some embodiments, a device includes: a first device package including: a first redistribution structure including a first redistribution line and a second redistribution line; a die on the first redistribution structure; a first via coupled to a first side of the first redistribution line; a second via coupled to a first side of the second redistribution line and extending through the second redistribution line; an encapsulant surrounding the die, the first via, and the second via; and a second redistribution structure over the encapsulant, the second redistribution structure electrically connected to the die, the first via, and the second via; a first conductive connector coupled to a second side of the first redistribution line, the first conductive connector disposed along a different axis than a longitudinal axis of the first via; and a second conductive connector coupled to a second side of the second redistribution line, the second conductive connector disposed along a longitudinal axis of the second via.

In some embodiments, the device further includes: a second device package including a first bond pad and a second bond pad, the first conductive connector coupled to the first bond pad, the second conductive connector coupled to the second bond pad. In some embodiments, the first bond pad and the second bond pad have a nickel finish. In some embodiments, the first redistribution line and the second redistribution line are formed from copper. In some embodiments, the first redistribution structure further includes: a first dielectric layer, the first redistribution line and the second redistribution line disposed on the first dielectric layer; and a second dielectric layer on the first dielectric layer. In some embodiments, the second via is longer than the first via.

In accordance with some embodiments, a method includes: forming a first redistribution structure including: depositing a first dielectric layer over a carrier substrate; forming a first conductive feature on the first dielectric layer; forming a second conductive feature on the first dielectric layer; forming a third conductive feature on the first dielectric layer; and depositing a second dielectric layer on the first conductive feature, the second conductive feature, and the third conductive feature; forming a first via on the first conductive feature; forming a second via on the second conductive feature, on the third conductive feature, and between the second conductive feature and the third conductive feature; attaching a die to the first redistribution structure adjacent the first via and the second via; encapsulating the die, the first via, and the second via with an encapsulant; planarizing the encapsulant, the first via, and the second via; and forming a second redistribution structure over the encapsulant, the first via, the second via, and the die.

In some embodiments, the method further includes: debonding the carrier substrate from the first redistribution structure; and attaching a device package to the first redistribution structure, the device package attached to the first conductive feature with a first connector, the device package attached to the second conductive feature and the third conductive feature with a second connector. In some embodiments, the first connector is not disposed along a longitudinal axis of the first via. In some embodiments, the second connector is disposed along a longitudinal axis of the second via. In some embodiments, the first via is longer than the second via after the planarizing.

In accordance with some embodiments, a method includes: depositing a first seed layer on a first dielectric layer; plating a first conductive feature and a second conductive feature on the first seed layer; depositing a second dielectric layer on the first conductive feature and the second conductive feature; forming a first opening in the second dielectric layer, the first opening exposing the first conductive feature, the second conductive feature, and the first dielectric layer; depositing a second seed layer on the second dielectric layer and in the first opening; plating a first via from portions of the second seed layer in the first opening; attaching a die to the second dielectric layer; and encapsulating the first via and the die with an encapsulant.

In some embodiments, the method further includes: forming a second opening in the first dielectric layer, the second opening exposing the first seed layer and the second seed layer; forming a reflowable material in the second opening, the reflowable material disposed along a longitudinal axis of the first via; and reflowing the reflowable material to form an intermetallic compound from the reflowable material and conductive material of the first seed layer, the second seed layer, and the first via. In some embodiments, the method further includes: attaching a device package to the first conductive feature and the second conductive feature with the reflowable material. In some embodiments, reflowing the reflowable material includes diffusing portions of the conductive material of the first via into the reflowable material. In some embodiments, the method further includes: forming a third conductive feature on the first dielectric layer; depositing the second dielectric layer on the third conductive feature; forming a second opening in the second dielectric layer, the second opening exposing the third conductive feature; depositing the second seed layer in the second opening; and plating a second via from portions of the second seed layer in the second opening. In some embodiments, the method further includes: forming a third opening in the first dielectric layer, the third opening exposing the first seed layer; forming a reflowable material in the third opening, the reflowable material disposed along a different axis than a longitudinal axis of the second via; and reflowing the reflowable material to form an intermetallic compound from the reflowable material and conductive material of the first seed layer. In some embodiments, reflowing the reflowable material includes diffusing portions of the conductive material of the third conductive feature into the reflowable material. In some embodiments, no portion of the intermetallic compound is formed between the second via and the first dielectric layer. In some embodiments, the method further includes: planarizing the first via, the second via, and the encapsulant, the first via being longer than the second via after the planarizing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first redistribution structure comprising a first redistribution line and a second redistribution line;
   an integrated circuit die attached to the first redistribution structure;
   a first through via coupled to the first redistribution line;
   a second through via coupled to the second redistribution line, the second through via having a height greater than a height of the first through via, a first surface of the second through via distal the first redistribution structure being level with a first surface of the first through via distal the first redistribution structure and a first surface of the integrated circuit die distal the first redistribution structure;
   an encapsulant surrounding the integrated circuit die, the first through via, and the second through via; and
   a second redistribution structure over the encapsulant, the second redistribution structure being coupled to the first through via, the second through via, and the integrated circuit die.

2. The device of claim 1, wherein the height of the first through via is greater than a height of the integrated circuit die.

3. The device of claim 1, wherein the second redistribution line comprises a first conductive feature and a second conductive feature separated from the first conductive feature, the second through via contacting sidewalls of the first conductive feature and the second conductive feature.

4. The device of claim 1, further comprising a device package bonded to the first redistribution structure by conductive connectors.

5. The device of claim 4, wherein the second through via comprises a seed layer and a conductive material, the seed layer contacting the second redistribution line, the conductive material contacting the conductive connectors.

6. The device of claim 4, wherein a first intermetallic compound contacts the first redistribution line and a first conductive connector of the conductive connectors, and wherein a second intermetallic compound is formed contacting the second redistribution line, the second through via, and a second conductive connector of the conductive connectors.

7. The device of claim 4, wherein a first conductive connector of the conductive connectors is coupled to the first through via, a centerline of the first conductive connector being misaligned from a centerline of the first through via, and wherein a second conductive connector of the conductive connectors is coupled to the second through via, a centerline of the second conductive connector being aligned with a centerline of the second through via.

8. A device comprising:
   a first conductive feature and a second conductive feature disposed on a first dielectric layer;
   a second dielectric layer over the first conductive feature, the second conductive feature, and the first dielectric layer;
   a first via extending through the second dielectric layer and contacting the first conductive feature and the second conductive feature;
   a die attached to the second dielectric layer;
   an encapsulant surrounding the die and the first via; and
   a first conductive connector extending through the first dielectric layer, the first conductive connector contacting the first conductive feature, the second conductive feature, the first dielectric layer, and the first via, wherein the first via comprises a seed layer, the seed layer contacting the first conductive feature, the second conductive feature, and the first conductive connector.

9. The device of claim 8, wherein the seed layer contacts the second dielectric layer, the first dielectric layer being separated from the seed layer.

10. The device of claim 8, wherein a first surface of the first via distal the second dielectric layer is level with a first surface of the die distal the second dielectric layer.

11. The device of claim 8, wherein the die is attached to the second dielectric layer using an adhesive, the encapsulant surrounding sidewalls of the adhesive.

12. The device of claim 8, further comprising:
   a third conductive feature disposed on the first dielectric layer;
   a second via extending through the second dielectric layer to contact the third conductive feature; and
   a second conductive connector extending through the first dielectric layer to contact the third conductive feature, a centerline of the second conductive feature being laterally misaligned with a centerline of the second via.

13. The device of claim 12, wherein a distance between the second via and the die is greater than a distance between the first via and the die.

14. A device comprising:
   a first redistribution structure comprising a first redistribution line and a second redistribution line disposed in a first dielectric layer;
   a die attached to the first redistribution structure;
   a first through via coupled to the first redistribution line;
   a second through via coupled to the second redistribution line;
   a first intermetallic compound contacting the first redistribution line, the first intermetallic compound being separated from the first through via by a first lateral distance;
   a second intermetallic compound contacting the second redistribution line and the second through via; and
   an encapsulant surrounding the die, the first through via, and the second through via wherein a first surface of the first through via distal the first redistribution structure is level with a first surface of the die distal the first redistribution structure, the first surface of the first through via is level with a first surface of the second through via distal the first redistribution structure, and the second through via has a height greater than a height of the first through via.

15. The device of claim 14, further comprising a first conductive connector, wherein the first intermetallic compound contacts the first conductive connector.

16. The device of claim 15, wherein the first redistribution structure further comprises a second dielectric layer over the first redistribution line, the second redistribution line, and the first dielectric layer, the first conductive connector extending through an opening in the second dielectric layer.

17. The device of claim 16, wherein an edge of the first intermetallic compound is separated from a sidewall of the first conductive connector in the second dielectric layer by a second lateral distance, the second lateral distance being from 2 μm to 13 μm.

18. The device of claim 17, wherein the first lateral distance is at least twice as large as the second lateral distance.

19. The device of claim 14, wherein the first lateral distance is from 25 μm to 35 μm.

* * * * *